(12) United States Patent
Ahn et al.

(10) Patent No.: US 10,566,427 B2
(45) Date of Patent: Feb. 18, 2020

(54) COPPER HALIDE SEMICONDUCTOR BASED ELECTRONIC DEVICES

(71) Applicant: PETALUX INC., Seongnam-si, Gyeonggi-do (KR)

(72) Inventors: Do Yeol Ahn, Seoul (KR); Sang Joon Park, Yongin-si (KR); Seung Hyun Yang, Yongin-si (KR); Jin Dong Song, Seoul (KR)

(73) Assignee: PETALUX INC., Seongnam-si, Gyeonggi-Do (KR)

( * ) Notice: Subject to any disclaimer, the term of this patent is extended or adjusted under 35 U.S.C. 154(b) by 0 days.

(21) Appl. No.: 15/780,369

(22) PCT Filed: Nov. 30, 2016

(86) PCT No.: PCT/KR2016/013946
§ 371 (c)(1),
(2) Date: May 31, 2018

(87) PCT Pub. No.: WO2017/095129
PCT Pub. Date: Jun. 8, 2017

(65) Prior Publication Data
US 2018/0350920 A1    Dec. 6, 2018

(30) Foreign Application Priority Data

Dec. 1, 2015 (KR) .................. 10-2015-0169603

(51) Int. Cl.
*H01L 29/24* (2006.01)
*H01L 29/78* (2006.01)
*H01L 29/10* (2006.01)

(52) U.S. Cl.
CPC ........ *H01L 29/242* (2013.01); *H01L 29/1025* (2013.01); *H01L 29/78* (2013.01)

(58) Field of Classification Search
CPC ............ H01L 29/1025; H01L 29/1029; H01L 29/1033; H01L 29/242; H01L 29/247; H01L 21/823412; H01L 21/823807; H01L 29/0843–0891; H01L 29/66636–66643; H01L 21/823418–823425; H01L 21/823814; H01L 29/66575–66598; H01L 29/66515

See application file for complete search history.

(56) References Cited

U.S. PATENT DOCUMENTS

2006/0261419 A1\* 11/2006 Kreupl ............... B82Y 10/00
257/401
2007/0184576 A1\* 8/2007 Chang .................. C23C 18/06
438/104

(Continued)

FOREIGN PATENT DOCUMENTS

JP     2010-530063      9/2010
KR    10-2007-0007967   1/2007

(Continued)

OTHER PUBLICATIONS

Tsung-Hsing Yu et al.; "Theoretical study of the two-dimensional electron mobility in strained III-nitride heterostructures"; Journal of Applied Physics, vol. 89, No. 7, Apr. 1, 2001, pp. 3827-3834.

(Continued)

*Primary Examiner* — Tucker J Wright
(74) *Attorney, Agent, or Firm* — Kile Park Reed & Houtteman PLLC

(57) ABSTRACT

A high output and high speed electronic device having low cost and high productivity is disclosed. The copper halide semiconductor based electronic device, includes a substrate, a copper halide channel layer formed on the substrate, an insulating layer formed on the copper halide channel layer, a gate electrode formed on the insulating layer, a first n+copper halide layer formed on the copper halide channel layer to be disposed at a first side of the gate electrode, the first n+copper halide layer comprising n-type impurities, a drain electrode formed on the first n+copper halide layer, a second n+copper halide layer formed on the copper halide channel layer to be disposed at a second side of the gate electrode, which is opposite to the first side, the second n+copper halide layer comprising n-type impurities, and a source electrode formed on the second n+copper halide layer.

16 Claims, 4 Drawing Sheets

(56) References Cited

U.S. PATENT DOCUMENTS

| | | |
|---|---|---|
| 2009/0014757 A1 | 1/2009 | Takulapalli et al. |
| 2011/0204483 A1 | 8/2011 | McNally et al. |
| 2012/0055236 A1* | 3/2012 | Takulapalli ........ G01N 27/4145 73/31.06 |

FOREIGN PATENT DOCUMENTS

| | | |
|---|---|---|
| KR | 10-0844094 | 7/2008 |
| KR | 10-1548901 | 9/2015 |
| WO | 2009/017882 | 2/2009 |

OTHER PUBLICATIONS

D. Ahn et al.; "Electric field dependence of intrasubband polar-optical phonon scattering in a quantum well"; Physical Review B, vol. 37, No. 5, Feb. 15, 1988, pp. 2529-2535.

Yifei Zhang et al.; "Charge control and mobility studies for an AlGaN/GaN high electron mobility transistor"; Journal of Applied Physics, vol. 85, No. 1, Jan. 1, 1999; pp. 587-594.

Seoung-Hwan Park et al.; "Optical gain in InGaN/InGaAlN quantum well structures with zero internal field", Applied Physics Letters, 92, 171115; 2008 American Institute of Physics; May 2, 2008; pp. 171115-1-171115-3.

Seoung-Hwan Park et al.; "Internal field engineering in CdZnO/MgZnO quantum well structures"; Applied Physics Letters, 94, 083507, 2009 American Institute of Physics; Feb. 27, 2009; pp. 083507-1-083507-3.

International Search Report for International Application No. PCT/KR2016/013946, dated Mar. 6, 2017.

Supplementary European Search Report corresponding to European Patent Application No. 16 87 1025.9, dated May 31, 2019.

Dominik Danieluk et al., "Optical properties of undoped and oxygen doped CuCl films on silicon substrates"; Journal of Materials Science, (2009); vol. 20, pp. 76-80.

\* cited by examiner

COPPER HALIDE SEMICONDUCTOR BASED ELECTRONIC DEVICES

TECHNICAL FIELD

The present invention relates to copper halide semiconductor based electronic devices, and more particularly, to copper halide semiconductor based electronic devices with high power and high speed.

BACKGROUND ART

In our lives, electronic devices are being used in various fields. These electronic devices have been made lightweight and miniaturized by the development of semiconductors using silicon. However, such silicon (Si)-based semiconductor devices have a small band gap so that those are difficult to apply to high power devices.

To solve the above problem, an electronic device based on gallium nitride (GaN) has been developed. GaN-based electronic devices commonly used for high-power and high-speed electronic devices adopt a sapphire substrate or a silicon carbide substrate. A lattice mismatch between GaN/AlGaN layer and a substrate is high, and high internal fields are induced between an interface the GaN/AlGaN or AlGaN/InGaN/GaN, which is used as an active layer, due to piezoelectric field and spontaneous polarization so that there is an advantage of resulting in a significant decrease in the mobility of the charge [T.-H. Yu and K. F. Brennan, J. Appl. Phys. 89, 382 (2001)].

This is because the mobility at room temperature is mainly determined by polar-optical-phonon scattering, and the scattering rate increases as the electric field applied perpendicularly to the active layer increases, which has been found by the present inventor theoretically, [D. Ahn, "Electric field dependence of intrasubband polar-optical phonon scattering in a quantum well", Phys. Rev. B 37, 2529 (1988)]. Further, other studies have also shown that spontaneous polarization on the surface also reduces mobility. [Y. Zhang and J. Singh, "Charge control and mobility studies for AlGaN/GaN high electron mobility transistor", Appl. Phys. 85, 587 (1999)].

However, there is a problem that such a GaN-based semiconductor adopts a sapphire substrate or a silicon carbide substrate so that manufacturing cost becomes expensive. Furthermore, the size of the sapphire substrate or the silicon carbide substrate is not large, so that the number of electronic devices that can be grown on the substrate is also small, resulting in low productivity.

DETAILED DESCRIPTION OF THE INVENTION

Objects of the Invention

A problem to be solved by the present invention is to provide a high-output and high-speed electronic device which can be produced at low cost and has improved productivity.

Technical Solution

According to one aspect of the present invention, there is provided a copper halide semiconductor based electronic device including a substrate, a copper halide channel layer, an insulating layer, a gate electrode, a first n+copper halide layer, a drain electrode, a second n+copper halide layer and a source electrode. The copper halide channel layer is formed on the substrate. The insulating layer is formed on the copper halide channel layer. The gate electrode is formed on the insulating layer. The first n+copper halide layer is formed on the copper halide channel layer to be disposed at a first side of the gate electrode. The first n+copper halide layer includes n-type impurities. The drain electrode is formed on the first n+copper halide layer. The second n+copper halide layer is formed on the copper halide channel layer to be disposed at a second side of the gate electrode, which is opposite to the first side. The second n+copper halide layer includes n-type impurities. The source electrode is formed on the second n+copper halide layer.

For example, the copper halide channel layer may include p-type impurities. In this case, the p-type impurities may be any one of oxygen (O), sulfur (S), and selenium (Se), and the n-type impurities may be any one of zinc (Zn) and magnesium (Mg).

On the other hand, the substrate may be any one of a silicon substrate, a gallium arsenide substrate, a glass substrate, a quartz substrate, and an alumina substrate.

The copper halide channel layer may include CuICl or CuBrCl. In this case, the copper halide semiconductor based electronic device may further include a barrier layer between the channel layer and the substrate, and the barrier layer may include CuCl.

Preferably, the copper halide semiconductor based electronic device may further include a buffer layer between the substrate and the copper halide channel layer.

In this case, the buffer layer may include CuCl.

On the other hand, the insulating layer may include silicon oxide (SiO2) or silicon nitride (SiN).

According to another aspect of the present invention, there is provided a copper halide semiconductor based electronic device including a substrate, a copper halide channel layer, an insulating layer, a gate electrode, a first p+copper halide layer, a drain electrode, a second p+copper halide layer and a source electrode. The copper halide channel layer is formed on the substrate and contains n-type impurities. The insulating layer is formed on the copper halide channel layer. The gate electrode is formed on the insulating layer. The first p+copper halide layer is formed on the copper halide channel layer to be disposed at a first side of the gate electrode and includes p-type impurities. The drain electrode is formed on the first p+copper halide layer. The second p+copper halide layer is formed on the copper halide channel layer to be located on a second side of the gate electrode, which is opposite to the first side, and includes p-type impurities. The source electrode is formed on the second p+copper halide layer.

For example, the p-type impurities may be any one of oxygen (O), sulfur (S), and selenium (Se), and the n-type impurities may be any one of zinc (Zn) and magnesium (Mg).

In this case, the copper halide channel layer may include CuICl or CuBrCl.

Preferably, the copper halide semiconductor based electronic device may further include a barrier layer between the channel layer and the substrate, and the barrier layer may include CuCl.

On the other hand, a memory device according to an embodiment of the present invention includes a capacitor for indicating on/off by charging or discharging a charge, and a switching element for controlling the capacitor. The switching element may be embodied through the copper halide semiconductor based electronic device described above.

Additionally, a logic device according to an embodiment of the present invention includes a plurality of switching elements, and at least one of the switching elements may be embodied through the copper halide semiconductor based electronic device described above.

Advantageous Effects

The copper halide semiconductor based electronic device according to the present invention has a high-bandgap to realize a high-speed and high-power device, and cannot adopt an expensive substrate, so that the production cost can be reduced and productivity can be improved.

MODE FOR INVENTION

Figure 1:
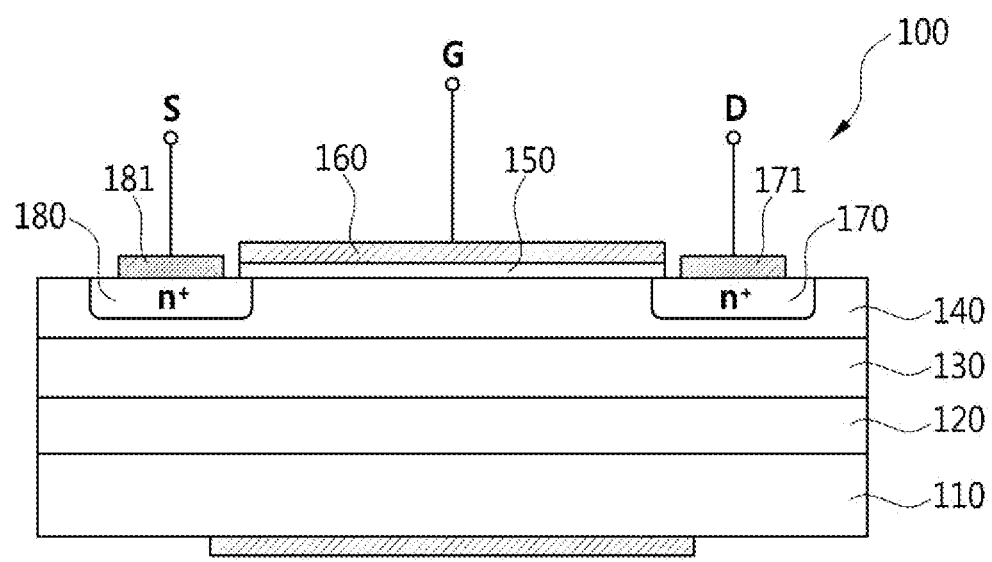
FIG. 1 is a schematic diagram illustrating a copper halide semiconductor based electronic device according to an exemplary embodiment of the present invention.

The present invention is susceptible of various modifications and various forms, specific embodiments are illustrated in the drawings and described in detail in the text. It should be understood, however, that the invention is not intended to be limited to the particular forms disclosed, but on the contrary, is intended to cover all modifications, equivalents, and alternatives falling within the spirit and scope of the invention.

The terms first, second, etc. may be used to describe various components, but the components should not be limited by the terms. The terms are used only for the purpose of distinguishing one component from another. For example, without departing from the scope of the present invention, the first component may be referred to as a second component, and similarly, the second component may also be referred to as a first component.

The terminology used herein is for the purpose of describing particular embodiments only and is not intended to be limiting of the invention. The singular forms "a," "an," and "the" include plural referents unless the context clearly dictates otherwise. In the present application, the terms "comprises", or "having", and the like, are used to specify that a feature, a number, a step, an operation, an element, a component, But do not preclude the presence or addition of one or more other features, integers, steps, operations, elements, parts or combinations thereof.

Means that the film (or layer) is "formed on" or "disposed on" means that in addition to being formed directly in contact, another film or another layer may be formed therebetween, and the term "directly formed" on a layer means that no other layer is intervening therebetween.

Unless otherwise defined, all terms used herein, including technical or scientific terms, have the same meaning as commonly understood by one of ordinary skill in the art to which this invention belongs.

Terms such as those defined in commonly used dictionaries are to be interpreted as having a meaning consistent with the meaning in the context of the relevant art and are not to be construed as ideal or overly formal in meaning unless explicitly defined in the present application.

Hereinafter, preferred embodiments of the present invention will be described in more detail with reference to the accompanying drawings.

FIG. 1 is a schematic diagram illustrating a copper halide semiconductor based electronic device according to an exemplary embodiment of the present invention.

Referring to FIG. 1, a copper halide semiconductor based electronic device 100 according to exemplary embodiments of the present invention includes a substrate 110, a copper halide channel layer 140, an insulating layer 150, a gate electrode 160, a first n+copper halide layer 170, a drain electrode 171, a second n+copper halide layer 180 and a source electrode 181. Preferably, the copper halide semiconductor based electronic device 100 may further include a buffer layer 120 between the substrate 110 and the copper halide channel layer 140. At this time, the buffer layer 120 may include CuCl. Further, the copper halide semiconductor based electronic device 100 may include a barrier layer 130 between the buffer layer 120 and the copper halide channel layer 140.

The substrate 110 may be a silicon substrate, a gallium arsenide substrate, a glass substrate, a quartz substrate, or an alumina substrate. For example, in this embodiment, the buffer layer 120 and the copper halide channel layer 140 may be formed on a silicon substrate.

The copper halide channel layer 140, the barrier layer 130 and the buffer layer 120 may be formed through molecular beam epitaxy (MBE), metal organic chemical vapor deposition (MOCVD), hydride vapor phase epitaxy (HVPE) atomic layer epitaxy, ALE (atomic layer epitaxy), and/or other similar methods.

The band gap energies of some of the copper halide semiconductors are shown in Table 1.

TABLE 1

| | Lattice Constant (Å) | Bandgap Energy (eV) |
| --- | --- | --- |
| Si | 5.43 | 1.1 (indirect) |
| CuCl | 5.42 | 3.399 |
| CuBr | 5.68 | 2.91 |
| CuI | 6.05 | 2.95 |

The buffer layer 120, the barrier layer 130 and the copper halide channel layer 140 may be formed on the (111) surface of the substrate 110 formed of silicon (Si). Relatively inexpensive silicon (Si) substrates may be used as compared to more expensive conventional substrate materials such as sapphire, since the lattice constant of the silicon (Si) is close to the lattice constant of the copper halide semiconductor forming the copper halide channel layer 140 as shown above Table 1, although the lattice constants of silicon (Si) have different crystal structures.

For example, while Si is known to have a diamond structure, capper chloride (CuCl) has a zinc blend structure equivalent to a diamond structure. In particular, the (111)

plane of the silicon (Si) substrate 110 may be suitable for the crystal structure of capper chloride, which may be stacked on the substrate 20, so that it may be used for manufacturing the copper halide semiconductor based electronic device 100. That is, as shown in Table 1, the copper halide semiconductor has a lattice constant similar to the (111) plane of silicon to have an advantage that it can grow on an inexpensive large-area substrate.

The copper halide (CuHa) channel layer 140 is formed on the substrate 110. The copper halide channel layer 140 may comprise CuICl or CuBrCl. Although the copper halide semiconductor generally operates as the p-type, the copper halide (CuHa) channel layer 140 may further include a p-type impurity in order to increase the hole. The p-type impurity may include any one of oxygen (O), sulfur (S), and selenium (Se).

The first n+copper halide layer 170 is formed on the copper halide channel layer 140 to be positioned on one side of the gate electrode 160, and the second n+copper halide layer 180 is formed on the copper halide channel layer 140 to be positioned on the other side of the gate electrode 160.

The first n+copper halide layer 170 and the second n+copper halide layer 180 may include n-type impurities, and the n-type impurity may include any one of zinc (Zn) and magnesium (Mg).

By controlling the compositions of the copper halide channel layer 140 (e.g., various components of the mole fraction), the lattice constant of the barrier layer 130 may also be controlled to reduce spontaneous polarization. Additionally, the lattice constant of the barrier layer 130 may be slightly less than or greater than the lattice constant of the halide copper channel layer 140 to reduce spontaneous polarization.

A more extensive discussion of how to select a particular mole fraction for reducing or canceling internal polarization in the copper halide channel layer 140 and how to select a specific mole fraction of the copper halide channel layer 140 to reduce spontaneous polarization is described in greater detail in "Optical gain in InGaN/InGaAlN quantum well structures", Applied Physics Letters, 92, 171115 by Seung-Hwan Park, Doyol Ahn and Jong-Wook Kim (May 2, 2008), and in "Internal field engineering in CdZnO/MgZnO quantum well structures", Applied Physics Letters, 94, 083507 by Seung-Hwan Park, Doyol Ahn (Feb. 27, 2009). The entire contents of both publications mentioned above are expressly incorporated herein by reference. For example, such methods may be used to select a particular mole fraction of the copper halide channel layer 140, which may include a CuIBrCl-type quaternary copper halide semiconductor material or a CuICl-type copper ternary copper halide semiconductor material.

As discussed above, the depolarization of the internal field may be due to the offset of the sum of the piezoelectric and spontaneous polarization of the copper halide channel layer 140. As a result, the electrical and optical properties of the copper halide channel layer 140 may be improved, for example, by having an internal field that is substantially reduced or substantially zero.

The copper halide semiconductor layer can have exciton binding energies that are at least four times greater than those of relatively large exciton binding energies, such as Group III nitride, thereby improving quantum efficiency.

The exciton binding energy is a measure of the interaction of holes and electrons with opposite charges, and may be used to predict the intensity of the hole-electron recombination process. For example, CuBr is known to have an exciton binding energy of about 108 meV, which is higher than the exciton binding energy of ZnO. As a result, copper halide semiconductor based electronic devices may be expected to have more power than conventional wide bandgap semiconductors such as Group III nitride or ZnO based light emitting devices.

Figure 6:
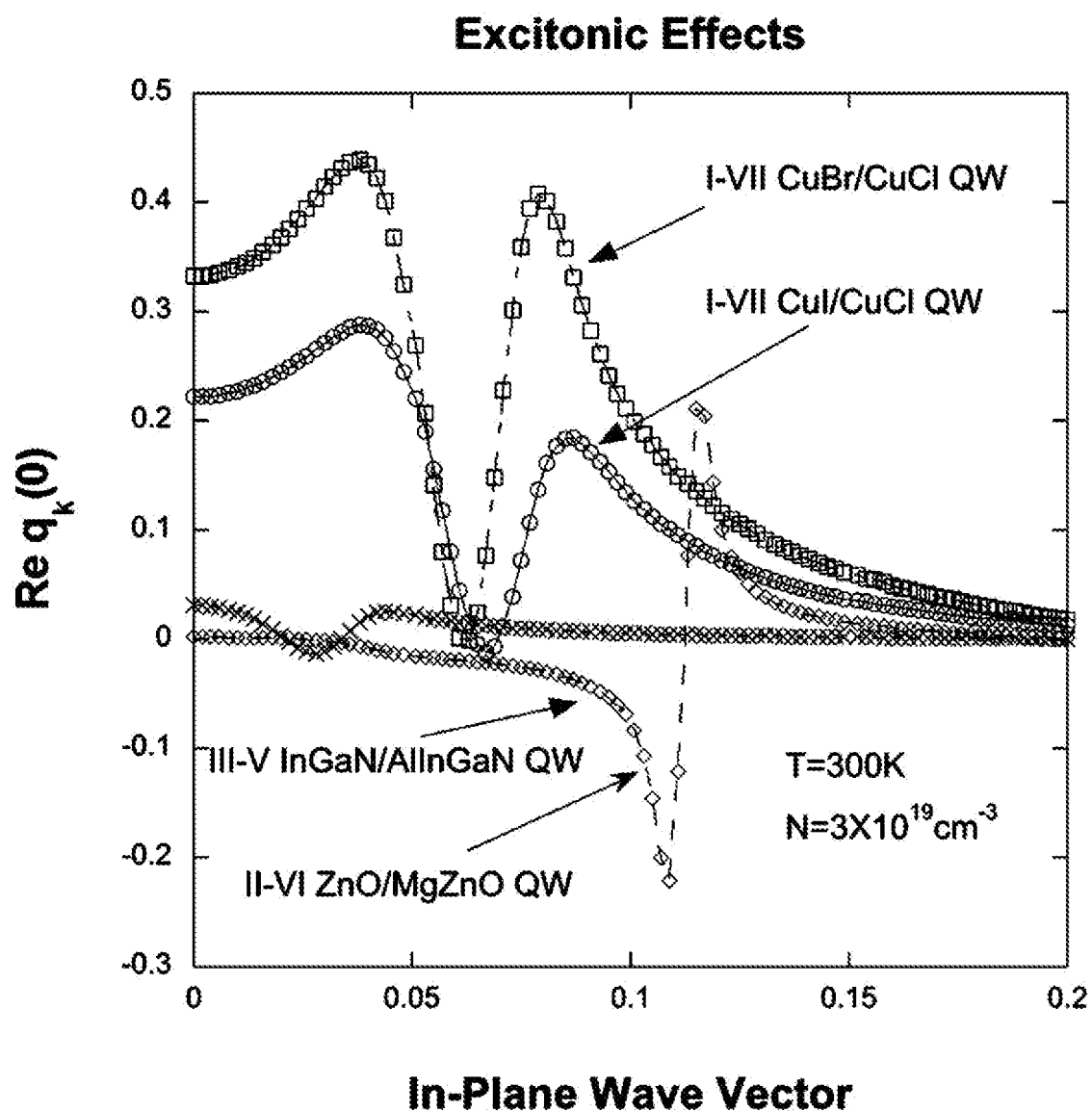
FIG. 6 is a graph showing the relationship between an in-plane wave vector and a vertex function in order to compare the exciton effect of a conventional gallium nitride semiconductor and a copper halide semiconductor according to the present invention.

FIG. 6 is a graph showing the relationship between the In-plane wave vector and the vertex function $q_k$ (0) in order to compare the Exciton effect of the conventional gallium nitride semiconductor and the copper halide semiconductor according to the present invention.

The graph of FIG. 6 shows $Req_k$ (0) between the conduction band and the ground state of the valence band.

The above vertex function $q_k$ (0) is expressed by the following Equation 1.

$$q_k(0) = i\Xi(0, \Delta_k)\mu*(k)\left[n_{ck}^0 - n_{vk}^0\right]\sum_{k'}\frac{V_s(k'-k)}{\mu*(k')}.$$

Equation 1

In the above Equation 1, $\Xi$ is a line shape function representing the spectrum of efficiency in the semiconductor, $\mu(k)$ is a dipole moment, V (k) is the screened coulomb potential, $n_{ck}^0$ and $n_{vk}^0$ are the quasi-equilibrium distribution of electrons in the conduction band and the valence band, respectively, and k is a wave vector.

In FIG. 6, the red graph corresponds to CuI/CuCl, the blue graph corresponds to CuBr/CuCl, the green graph corresponds to $ZnO/Mg_{0.3}Zn_{0.7}$, and the black graph corresponds to $In_{0.2}Ga_{0.8}N/Al_{0.2}In_{0.005}G_{0.7995}N$. The above was calculated assuming that carrier density is $3\times10^{19}$ cm$^{-3}$, the interband relation time is 10 fs and the correlation time is 25 fs.

As shown in FIG. 6, the red and the blue graphs corresponding to the present invention are improved compared to the conventional green and black graphs.

The barrier layer 130 may be disposed between the buffer layer 120 and the copper halide channel layer 140 to reduce the total polarization in the copper halide channel layer 140, thereby increasing the quantum efficiency of the copper halide semiconductor based electronic device 100.

The insulating layer 150 is formed on the copper halide channel layer 140. The insulating layer 150 may be formed to include silicon oxide ($SiO_2$) or silicon nitride (SiN).

The gate electrode 160 is formed on the insulating layer 150, the drain electrode 171 is formed on the first n+copper halide layer 170, and the source electrode 181 is formed on the second n+copper halide layer 180. The gate electrode 160, the drain electrode 171 and the source electrode 181 may be formed of, for example, aluminum, gold, platinum, silver, and the like, and/or combinations thereof.

The copper halide semiconductor based electronic device described above can be operated as a transistor and accordingly can be applied to various circuits as described in the following examples.

Figure 2:
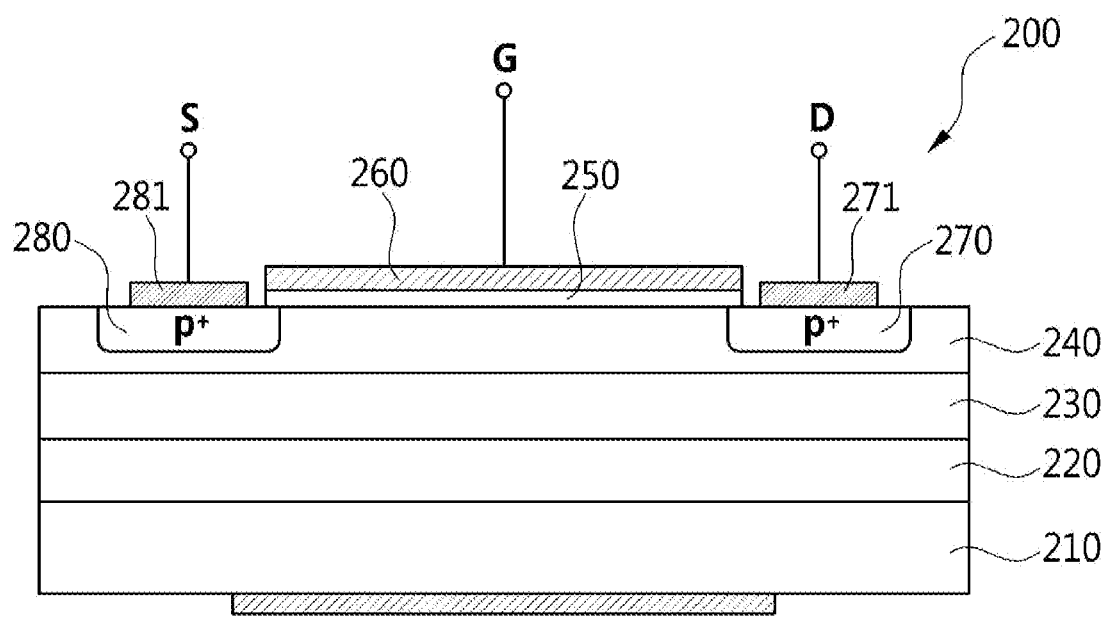
FIG. 2 is a schematic diagram illustrating a copper halide semiconductor based electronic device according to another exemplary embodiment of the present invention.

FIG. 2 is a schematic diagram illustrating a copper halide semiconductor based electronic device according to another exemplary embodiment of the present invention.

Referring to FIG. 2, a copper halide semiconductor based electronic device 200 according to another exemplary embodiments of the present invention includes a substrate 210, a copper halide channel layer 240, an insulating layer 250, a gate electrode 260, a first p+copper halide layer 270, a drain electrode 271, a second p+copper halide layer 280 and a source electrode 281. The structure shown in FIG. 2 is substantially the same as that shown in FIG. 1 except that the p-type and the n-type are replaced with each other. Thus, repetitive explanation will be omitted.

However, in the case of the copper halide channel layer 240 includes n-type impurities which are injected, since the copper halide channel layer 240 is p-type when no impurities are injected.

Figure 3:
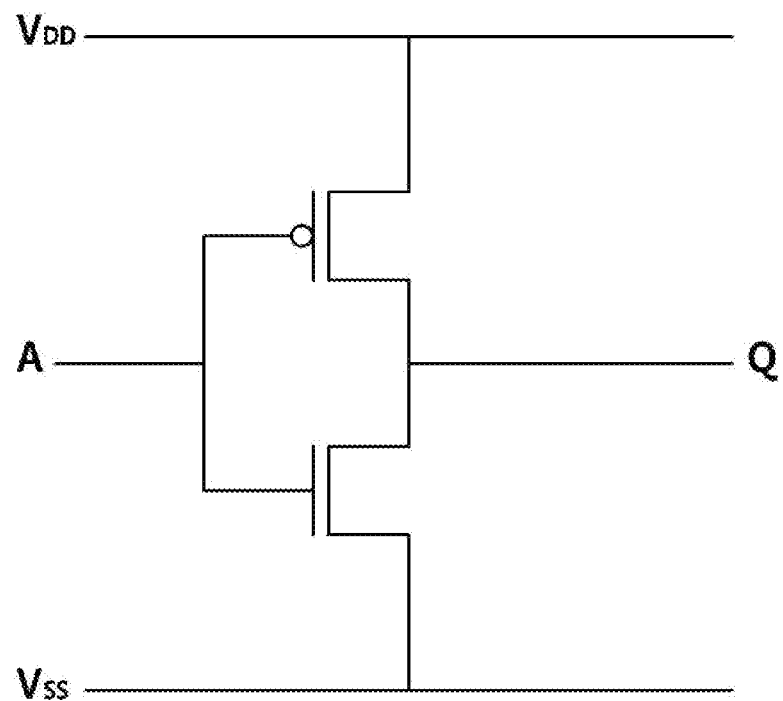
FIG. 3 is a circuit diagram schematically showing a CMOS device constructed through electronic devices in FIGS. 1 and 2.

FIG. 3 is a circuit diagram schematically showing a CMOS device constructed through electronic devices in FIGS. 1 and 2.

Referring to FIG. 3, a CMOS device may be implemented using the copper halide semiconductor based electronic device implemented in FIGS. 1 and 2. As described above, when complementary formed copper halide semiconductor based electronic devices according to the present invention are used to implement a CMOS device, a high-speed and high-power device having a high bandgap can be realized.

Figure 4:
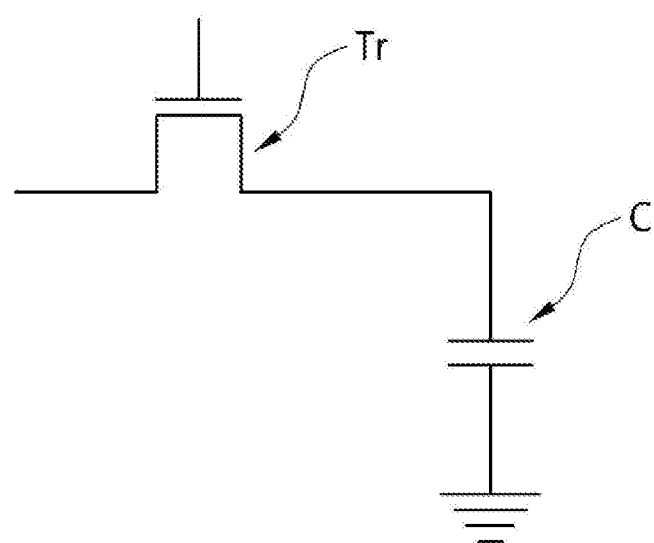
FIG. 4 is a circuit diagram of a memory element to which the copper halide semiconductor based electronic device of FIG. 1 is applied.

FIG. 4 is a circuit diagram of a memory element to which the copper halide semiconductor based electronic device of FIG. 1 is applied.

Referring to FIG. 4, a memory element according to the present invention includes a capacitor C for indicating on/off by charging or discharging a charge, and a switching element Tr for controlling the capacitor C. The switching element Tr may be embodied as a copper halide semiconductor based electronic element as described above.

For example, a logic value one is assigned when the capacitor C is charged, and a logic value zero is assigned when the capacitor C is discharged. For example, when a logic value zero is initially assigned to the capacitor C, a high voltage is applied to the gate electrode of the switching element Tr to turn on the switching element Tr so that the capacitor C is charged to be assigned a logic value one, and then a low voltage is applied to the gate electrode of the switching element Tr to turn off the switching element Tr so that the logic value one is stored in the capacitor C.

When a high voltage is applied to the gate electrode of the switching element Tr to store the logic value zero in the capacitor C, the switching element Tr is turned on to discharge the capacitor C, and then the low voltage is applied to the gate electrode of the switching element Tr to turn off the switching element Tr so that the logic value zero is stored in the capacitor C.

It is apparent to those skilled in the art that such a memory element may be implemented to include more components as an example of the memory element that is most simply implemented.

Figure 5:
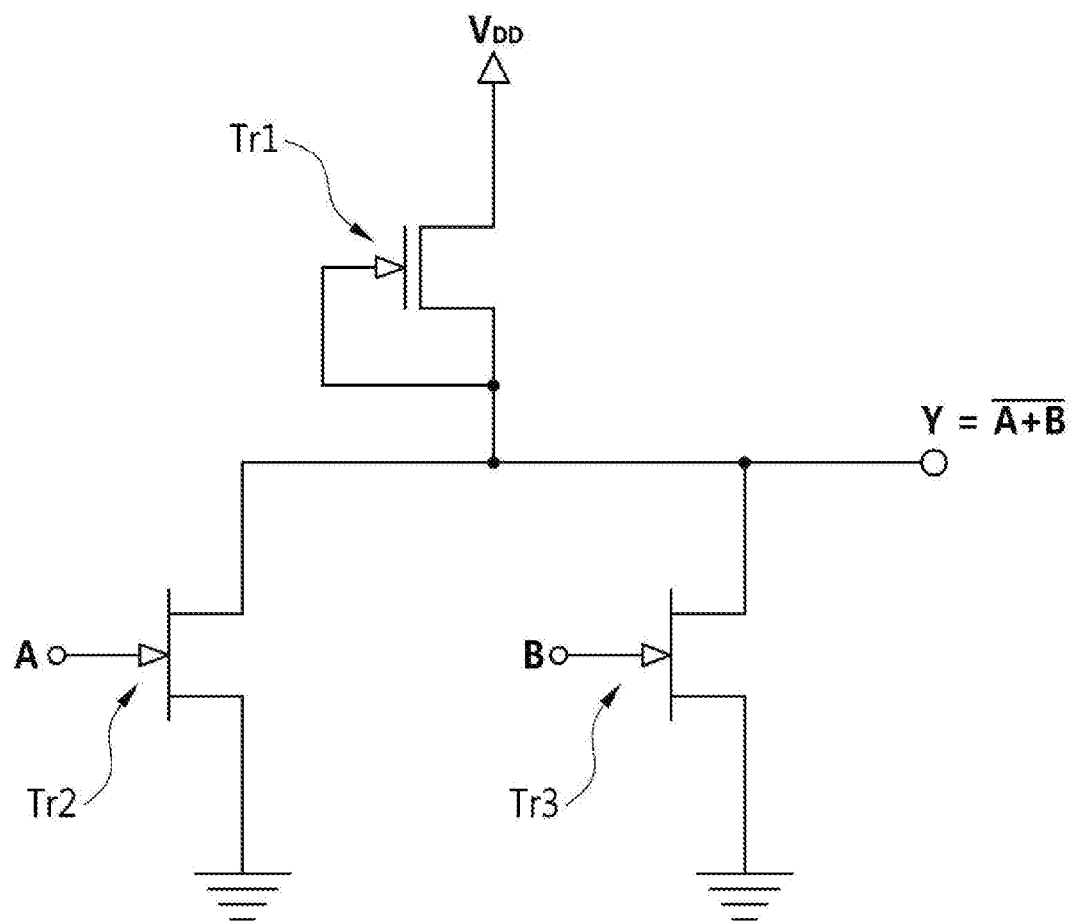
FIG. 5 is a circuit diagram of a NOR logic circuit to which the copper halide semiconductor based electronic device of FIG. 1 is applied.

FIG. 5 is a circuit diagram of a NOR logic circuit to which the copper halide semiconductor based electronic device of FIG. 1 is applied.

Referring to FIG. 5, the logic device according to the present invention is implemented with a plurality of switching devices, and the switching device can be implemented with the copper halide semiconductor based electronic device described above.

FIG. 5 shows, for example, a NOR logic circuit comprising three switching elements Tr1, Tr2 and Tr3. When a high voltage is applied to one of the terminal A or the terminal B, a low voltage is outputted, and when a low voltage is applied to both of the terminal A and the terminal B, a high voltage is outputted.

For example, the NOR logic circuit is taken as an example in the present embodiment, but various logic circuits such as AND logic circuit and NOT logic circuit can be implemented through a copper halide semiconductor based electronic device according to the present invention.

The copper halide semiconductor based electronic device according to the present invention can realize a high-speed and high-power device because of its large band gap, and cannot use an expensive substrate, so that the production cost can be reduced, and productivity can be improved.

Although the present invention has been described in the detailed description of the invention with reference to exemplary embodiments of the present invention, it will be understood to those skilled in the art that various modifications and variation can be made in the present invention without departing from the spirit or scope of the invention.

The invention claimed is:

1. A copper halide semiconductor based electronic device, comprising:
    a substrate;
    a copper halide channel layer formed on the substrate;
    an insulating layer formed on the copper halide channel layer;
    a gate electrode formed on the insulating layer;
    a first n+copper halide layer formed on the copper halide channel layer to be disposed at a first side of the gate electrode, the first n+copper halide layer comprising n-type impurities;
    a drain electrode formed on the first n+copper halide layer;
    a second n+copper halide layer formed on the copper halide channel layer to be disposed at a second side of the gate electrode, which is opposite to the first side, the second n+copper halide layer comprising n-type impurities; and
    a source electrode formed on the second n+copper halide layer.

2. The copper halide semiconductor based electronic device of claim 1, wherein the copper halide channel layer comprises p-type impurities.

3. The copper halide semiconductor based electronic device of claim 2, wherein the p-type impurities are any one of oxygen (O), sulfur (S), and selenium (Se).

4. The copper halide semiconductor based electronic device of claim 1, wherein the n-type impurities are any one of zinc (Zn) and magnesium (Mg).

5. The copper halide semiconductor based electronic device of claim 1, wherein the substrate is any one of a silicon substrate, a gallium arsenide substrate, a glass substrate, a quartz substrate, and an alumina substrate.

6. The copper halide semiconductor based electronic device of claim 1, wherein the copper halide channel layer comprises CuICl or CuBrCl.

7. The copper halide semiconductor based electronic device of claim 6, further comprising:
    a barrier layer between the channel layer and the substrate, wherein the barrier layer comprises CuCl.

8. The copper halide semiconductor based electronic device of claim 1, further comprising:
    a buffer layer between the substrate and the copper halide channel layer.

9. The copper halide semiconductor based electronic device of claim 8, wherein the buffer layer comprises CuCl.

10. The copper halide semiconductor based electronic device of claim 1, wherein the insulating layer comprises silicon oxide ($SiO_2$) or silicon nitride (SiN).

11. A memory device comprising:
    a capacitor for indicating on/off by charging or discharging a charge; and
    a switching element for controlling the capacitor, wherein the switching element is embodied through the copper halide semiconductor based electronic device according to claim 1.

12. A logic device comprising a plurality of switching elements, wherein at least one of the switching elements is embodied through the copper halide semiconductor based electronic device according to claim 1.

13. A copper halide semiconductor based electronic device, comprising:
- a substrate;
- a copper halide channel layer formed on the substrate and comprising n-type impurities;
- an insulating layer formed on the copper halide channel layer;
- a gate electrode formed on the insulating layer;
- a first p+copper halide layer formed on the copper halide channel layer to be disposed at a first side of the gate electrode and comprising p-type impurities;
- a drain electrode formed on the first p+copper halide layer;
- a second p+copper halide layer formed on the copper halide channel layer to be located on a second side of the gate electrode, which is opposite to the first side, and comprising p-type impurities; and
- a source electrode formed on the second p+copper halide layer.

14. The copper halide semiconductor based electronic device of claim 13, wherein the p-type impurities are any one of oxygen (O), sulfur (S), and selenium (Se), and the n-type impurities are any one of zinc (Zn) and magnesium (Mg).

15. The copper halide semiconductor based electronic device of claim 13, wherein the copper halide channel layer comprises CuICl or CuBrCl.

16. The copper halide semiconductor based electronic device of claim 13, further comprising:
- a barrier layer between the channel layer and the substrate, wherein the barrier layer comprises CuCl.

* * * * *